United States Patent [19]

Nomura et al.

[11] Patent Number: 4,734,345
[45] Date of Patent: Mar. 29, 1988

[54] SEMICONDUCTOR IC AND METHOD OF MAKING THE SAME

[75] Inventors: Noboru Nomura, Kyoto; Koichi Kugimiya, Toyonaka, both of Japan

[73] Assignee: Matsushita Electric Industrial Co., Ltd., Kadoma, Japan

[21] Appl. No.: 869,844

[22] Filed: May 28, 1986

Related U.S. Application Data

[63] Continuation of Ser. No. 539,317, Oct. 5, 1983, abandoned.

[30] Foreign Application Priority Data

| Oct. 7, 1982 | [JP] | Japan | 57-177234 |
| Oct. 7, 1982 | [JP] | Japan | 57-177250 |
| May 12, 1983 | [JP] | Japan | 58-83023 |
| May 27, 1983 | [JP] | Japan | 58-94323 |

[51] Int. Cl.⁴ .............................................. G03H 1/04
[52] U.S. Cl. ..................................... 430/1; 430/311; 430/313; 430/326; 430/327; 430/328; 430/394
[58] Field of Search .......... 430/1, 2, 311, 313, 430/319, 394, 326, 328, 327

[56] References Cited

U.S. PATENT DOCUMENTS

| 3,658,526 | 4/1972 | Haugh | 430/2 X |
| 4,343,874 | 8/1982 | Haines | 430/1 |

*Primary Examiner*—John E. Kittle
*Assistant Examiner*—José G. Dees
*Attorney, Agent, or Firm*—Cushman, Darby & Cushman

[57] ABSTRACT

A method and apparatus for making a semiconductor device involves placing a semiconductor wafer in a position where two coherent light beams can interfere thereon. One of the coherent light beams is modulated by a hologram inserted in the path of the beam projected onto a surface of the semiconductor wafer. The other of the coherent light beams is also projected onto the same surface of the semiconductor wafer. The two interfering light beams form a pattern on a photoresist film found on the surface of the semiconductor wafer, which can be developed by photoresist techniques.

9 Claims, 41 Drawing Figures

FIG.1 (Prior Art)
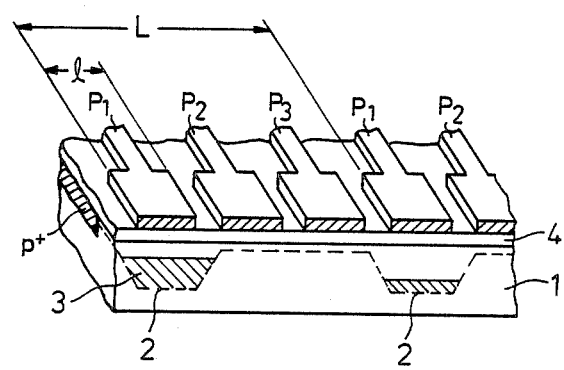
FIG.2 (a) (Prior Art)
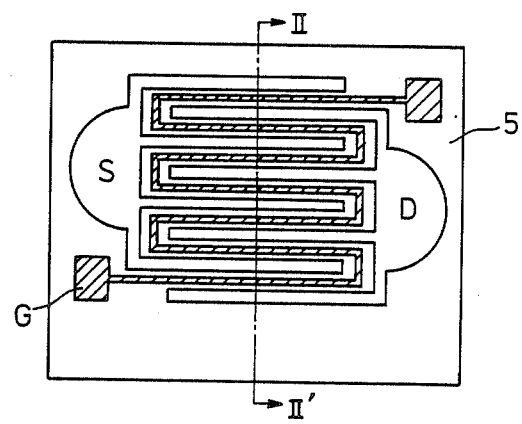
FIG.2 (b) (Prior Art)
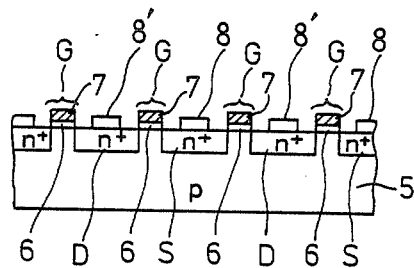

(a)

(b)

(c)

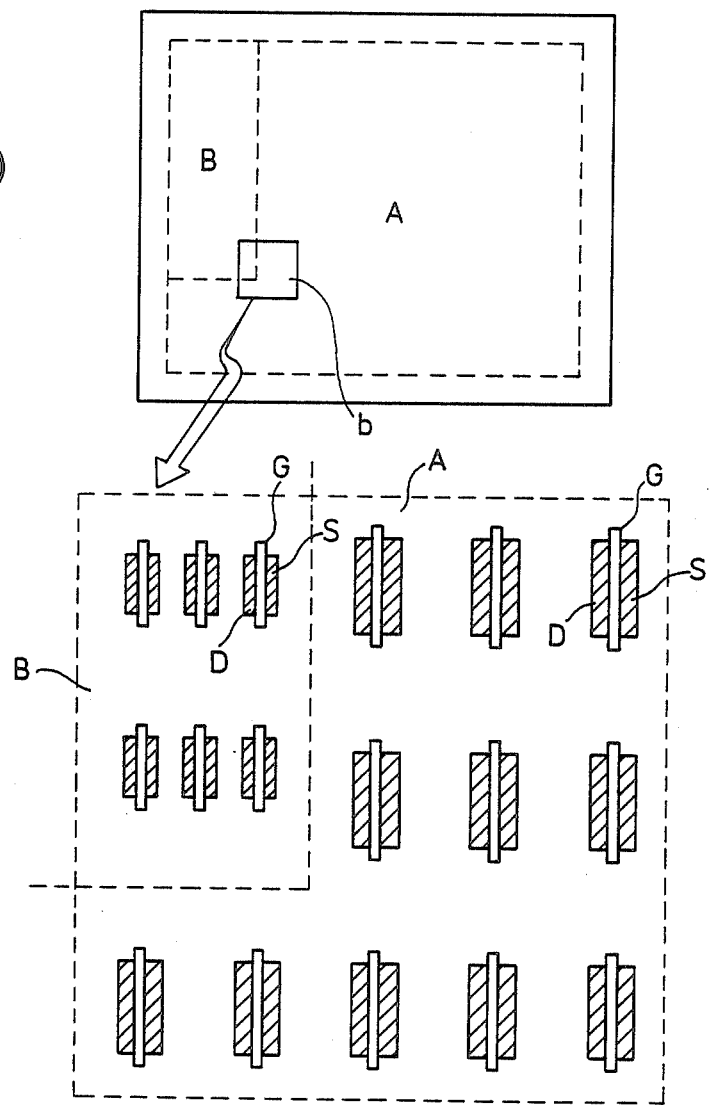

SEMICONDUCTOR IC AND METHOD OF MAKING THE SAME

This is a continuation of application Ser. No. 539,317, filed Oct. 5, 1983, which was abandoned upon the filing hereof.

BACKGROUND OF THE INVENTION

1. Field of the Invention

The present invention relates to semiconductor ICs, particularly those having sub-micron rules, e.g., 1 $\mu$um or less, and method of making the same.

2. Description of the Prior Art

The semiconductor ICs are becoming more and more highly integrated in recent years, and sizes of the unitary semiconductor devices are about to become submicron. In order to form such very minute pattern, the conventional way of using ultraviolet ray exposure method comes to the limit of technology, and therefore in these years, far-UV rays, X-rays, electron beams, ion beams, etc. are being used. However, apparatus to carry out the abovementioned far-UV, X-ray, electron beams, or ion beams exposurings are very much expensive, and more over the exposuring of intensity of X-rays, electron beams or ion beams are low and accordingly takes a long exposuring time, and therefore it is not suitable for a mass production of the semiconductor ICs.

As semiconductor IC having repeated structure, there is a CCd as shown in FIG. 1, which is fragmental perspective view of an essential part of the IC which has three kinds of electrodes. The CCD is substantially an IC utilizing MOS capacitors, and its structure has, for instance, an ion implanted region P+ for channel stopping formed from a surface of P-type silicon substrate 1, and thereon three kinds of electrodes P1, P2 and P3 are formed with oxide film thereunder on the surface of the substrate 1. When a positive potential is applied to the electrode P1, P-type majority carriers in the silicon substrate 1 is expelled, and thereby potential wells 2 are formed, and the ion-implanted channel stopper region P+ limits expansion of the potential wells 2. The potential wells 2 store therein thermally excited minority carriers. When potentials are impressed in turn on the electrodes P1, P2 and P3, then the potential wells 2 move in the silicon substrate 1 along the parts under the electrodes $P_1$, $P_2$ and $P_3$, and therefore the minority carriers are transferred with the transferring of the potential well. In the example of FIG. 1, pitch L from one electrode $P_1$ to the next same kind electrode $P_1$ is width of a unit cell, and the pitch L is as large as six times of an electrode width l in the ordinary design.

In general, a CCD comprises 96 or 256 or more number of the above-mentioned unit cells in a line and its function is limited, for instance, in application for delay device or imaging apparatus. In such application case, function to be carried out by three kinds of electrodes $P_1$, $P_2$ and $P_3$ is to carry minority carriers, and there is no other function in comparison with transistors in IC. As other CCDs than that shown in FIG. 1, there are proposed those of two phase type or C4D structure which is regarded as having minimum size. In the CCD of C4D structure, effective barrier width as long as half the minimum designed electrode width has been realized by ion implantation method, and a length of four times the minimum line width is one unit cell length.

As is described above, in the CCD applying MOS capacitors, there is a relation $$L = 2kT \quad (k=1, 2, 3, \ldots) \tag{1}$$

between the minimum designed electrode length T and the unit cell length L. But the function of this device is limited only for transferring minority carriers which are immediately under the electrodes, and its application is narrow. On the other hand, in BBDs which serve similar function with that of CCD, such structures of applications of transistors are proposed as a junction type FET wherein a MOSFET switch is formed in n-type epitaxial sillicon layer or a Schottky barrier FET. But in these structure, one unit cell length to form the transistor can not be limited to the minimum size. Accordingly, there is no particular size relation between the one unit cell length and the minimum size as proposed in the CCD.

In the case of semiconductor IC memory which is a representative example of IC having repeated pattern, neither gate positions, nor electrode positions, nor contact-window positions is not selected to be 2kT for the minimum line width T. Furthermore, in one unit cell, for instance, of MOS memory, enhancement type transistors and depletion type transistors are employed in combination. In such configuration, the gate lengths and gate widths and also polycrystalline silicon wiring width are different from each other and not unified. Accordingly when designing the plan view pattern of such IC, the practice is that the individual transistors are designed one by one and the designing is not efficient.

In large type transistors such as power transistors, which have large mutual conductance Gm, a zigzag pattern is formed as shown in FIG. 2, wherein crosswise sectional configuration has pattern of repetitions of gate electrodes. In such transistors, its Gm has the following relation $$Gm \propto aW/L_c \tag{2}$$

where, $L_c$ is channel length, W is gate width and a is vertical height in a direction normal to PN junction. In order to increase Gm, it is necessary to decrease the channel length $L_c$ and increase the gate width W. Therefore such configuration as shown in FIG. 2(a) wherein source S and drain D are disposed in parallel rows and in zigzag disposition with a zigzag shape gate inbetween, is necessary.

In FIG. 2(b) which shows the cross section along the sectional plane II-II', gate electrodes 7 is formed by polycrystalline silicon on a gate oxide film 6, by utilizing known photolithographic etching And source region S and drain region D are formed on both sides of the gate by defusing an impurity in the substrate 5, and thereon source electrode 8 and drain electrode 8' are provided.

In the above-mentioned zigzag-structure large power transistor, when the gate electrode is formed in zigzag pattern in order to obtain a larger gate width and shorter channel length, undesirable strong electric fields are centered at turning points of the zigzag-shaped gate, and undesirable trouble is likely to be induced when the IC is highly integrated, and accordingly the zigzag pattern is not practical In semiconductor IC memory as a representative example of repetition pattern, gate positions or electrode positions or contact window positions have not been selected to be repetition interval of 2kT for minimum line width T. Also in one device of MOS type IC, where enhancement type FET and depletion type FET are used in combination, their gate lengths, gate widths and wiring widths are not unified, thereby simplification of design of plan view configuration is not achievable.

Conventional exposuring methods to make semiconductor IC are as follows. Hitherto, ultraviolet ray exposure in photolithographic method has been widely used, but its resolution limit is about 1 μm limited by defraction and interference of light, and it has not been possible to obtain submicron line width. FIG. 3 schematically shows a configuration where contact exposuring on a semiconductor substrate is carried out. A mask pattern 12 provided on a glass plate is put on a wafer 13 coated with a photoresist film 14. Then, UV-rays 16 are projected on the wafer through the glass plate 11 and then parts of the photoresist film 14 which is not covered by the mask pattern 12 is exposed to the UV-rays, so that unexposed parts 15 disposed identical to the mask pattern 12 is obtained. In this method, due to effect of light defraction from edges of the mask pattern 12, practical resolution is limited to about 1 μm. Alternatively, there is compressed projection method where the mask pattern is projected in smaller size on the photoresist film, but even with the method, practical limit of resolution is about 0.8 μm.

FIG. 4 schematically shows principle of conventional holography. Way of recording a hologram on a wafer W is described. Coherent rays from a light source such as laser source is divided by a beam splitter BS into transmission rays 17 and reflected rays 18, and the transmission rays 17 are projected on an object B, and rays reflected from the object B are projected on the wafer W. On the other hand, the reflected rays 18 are after reflection by mirror M lead onto the wafer W as reference rays. Then the rays reflected from the object B and the reference rays from the mirror M mutually interfere, and as a result of the interference, amplitude modulation of light is produced on a photosensitive film on a wafer to form a hologram. For reproducing a holography image from the hologram, the same reference rays 18 are projected onto the hologram on the wafer W, and then by observing from a point E an image is observed as if the object B exists at the position where it has been, as a result of defracted rays from the hologram. In this case, the pattern to be recorded on the hologram is an interference stripe pattern produced as a result of interference between rays reflected from the object and the reference rays, and information of a point on the object effect all the area of the hologram and the hologram as such has no clear pattern noticeable to human eyes, which produces the holography image only when the reproducing rays are emanated. Though there is a method to produce a hologram by digital signal, the hologram as such of this case is only dot pattern of dark and bright dots, and the holography image is produced only when reference rays are projected on the hologram.

FIG. 5 schematically shows a device to produce a holographic fringe by interference of two light beams. In this apparatus, an incident parallel light beam 19 is divided by a beam splitter BS into transmission rays 21 and reflection rays 20 both are reflected by mirror M and M' respectively and the reflected transmission rays 21 and reflected rays 20 are projected both on a wafer W and superposed thereon. Thus a conjugate two light beams are incident on the wafer W, and accordingly interference fringe is recorded on a photoresist film on the wafer W. In this method, an arbitrarily desired pattern can not be formed, but only black and white stripe corresponding to interference fringe as shown in FIG. 6 is obtainable.

As has been described, the conventional methods only can produce about 0.8 μm line width pattern by photolithographic method or only simple parallel pattern upto about 0.1 μm line width as a result of interference fringe of coherent two light beams or vague hologram pattern which has such vague and rough pattern as not usable for semiconductor device pattern.

SUMMARY OF THE INVENTION

In view of the above-mentioned problem, the purpose of the present invention is to provide semiconductor integrated circuit (IC) with very minute unit cell size with which better function and efficiency are performed by adopting a novel rule of plan view structure of an IC. Another objective of the present invention is to manufacture the semiconductor IC with cheaper manufacturing apparatus and with more efficient through-put. A novel feature of the present invention is to manufacture a highly integrated LSI by forming very minute pattern with interference of a pair of conjugate and coherent rays on a photoresist film formed on a semiconductor wafer.

A semiconductor device in accordance with the present invention comprises a plural number of transistors formed in regions of length 2mT, where m is positive integers and T is minimum line width which can be controlledly produced on said semiconductor, to produce plural parallel gates.

The semiconductor device in accordance with the present invention can provide transistors of high mutual conductance Gm.

The manufacturing method in accordance with the present invention enables making of very minute pattern by making interference of two coherent light beams, at least in one path of which a hologram is disposed in a manner that a light from the hologram and another light beam make the interference, and thereby to make the interference of two light beams being recorded on a photoresist film on a wafer, to produce minute pattern.

By utilzing the present invention a transistor can be formed in a unit cell region having a length of 2mT for minimum line width T, thereby to make very minute unit device having submicron line width.

The present invention can provide transistors of high mutual conductance Gm in a circuit block containing three or more transistors, by disposing electrodes in parallel dispositions and by forming the electrode in certain line widths, thereby enabling making different transistors of various functions at a same time, and also a transistor of high mutual conductance Gm by making a large number of transistors with the same gate widths and connected each other in parallel.

By applying configuration in accordance with the present invention to electron beam exposure method, necessity of compensation of proximation effect due to electron beam can be eliminated, thereby enabling to simplify a program in an electron beam drawing.

By employing the manufacturing method of interfering two light beams containing a hologram in at least one path of the light beam, a very high resolution and high composed pattern is obtainable on the semiconductor wafer. In this method, since the hologram can be used in a relation apart from the wafer, there is no fear that the pattern on the hologram is damaged by contacting with the wafer. Furthermore, since the information of the pattern on the hologram is integrated with respect to one point of the wafer, even a containing of some defect or dust on the hologram results no adverse effect produced on the pattern of the wafer.

Furthermore, in the above-mentioned method, by varying a wavelength of the coherent rays to produce the hologram and other coherent rays for reproducing the hologram from each other, rays issued from the hologram can be expanded or compressed freely, and therefore, size of the pattern can be arbitrarily changed.

BRIEF EXPLANATION OF THE DRAWING

FIG. 1 is the perspective view of the part of the conventional CCD.

FIG. 2(a) is the plan view of a conventional high mutual conductance transistor.

FIG. 2(b) is a sectional elevation view at the line II-II' of FIG. 2(a).

FIG. 15(a) and FIG. 15(b) are general front view and partially enlarged front view of one example of a semiconductor IC embodying the present invention.

FIG. 24 is a plan view of still another example of making a semiconductor IC embodying the present invention.

FIG. 25 is a plan view of still another example of making a semicondcutor IC embodying the present invention.

FIG. 26 is a plan view of still another example of making a semiconductor IC embodying the present invention.

DESCRIPTION OF THE PREFERRED EMBODIMENTS

Figure 3:
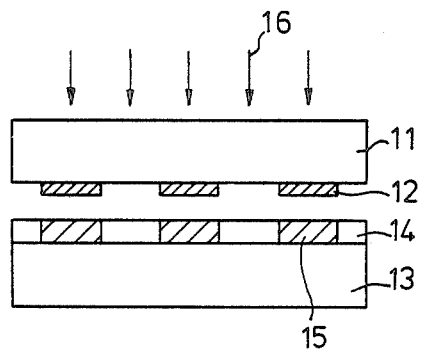
FIG. 3 is the schematic sectional view of the conventional manufacturing of photolithographic technology.
Figure 4:
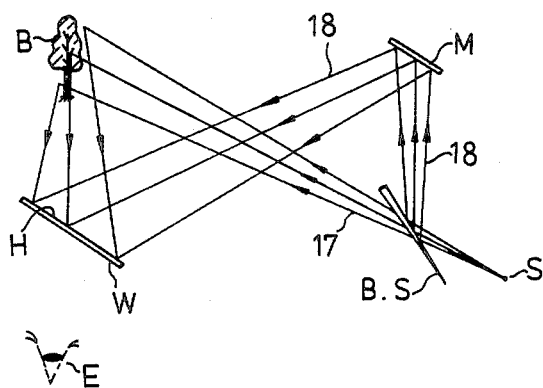
FIG. 4 is the schematic view showing principle of the conventional holography exposure.
Figure 5:
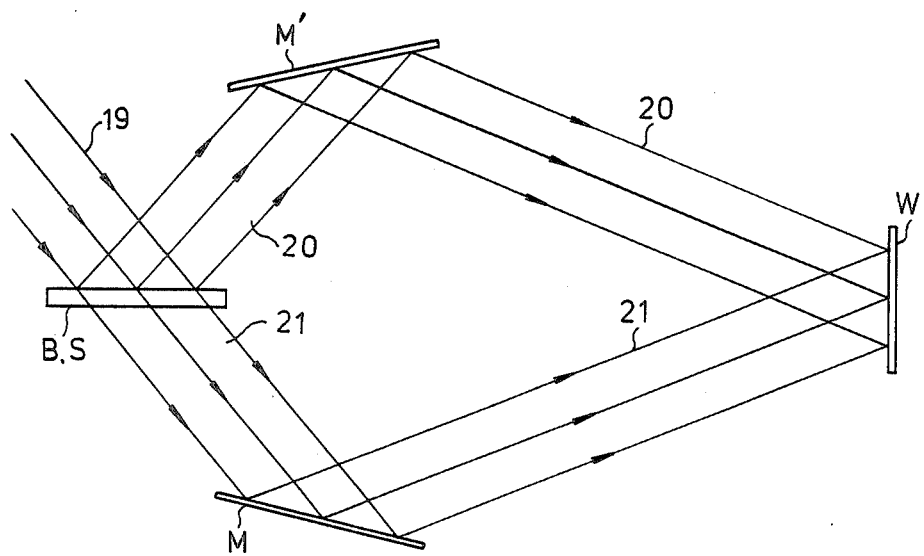
FIG. 5 is the schematic disposition diagram showing the conventional holography exposure method for making two light beams interference pattern.
Figure 6:
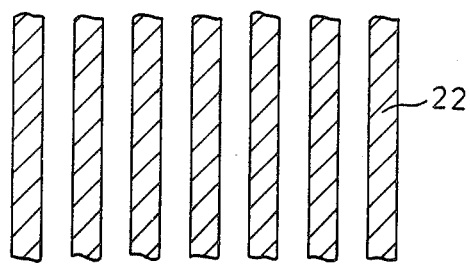
FIG. 6 is the front view pattern showing lattice stripe pattern obtained by the disposition of FIG. 5.
Figure 7:
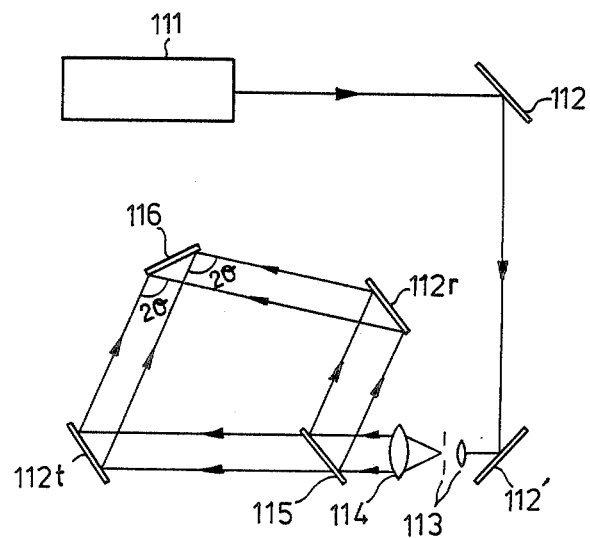
FIG. 7 is a disposition diagram of a laser holography device.

FIG. 7 is a disposition diagram showing principle of laser holography apparatus to make a semiconductor IC. A laser source 111 emit coherent rays, and the rays are reflected by mirrors 112 and 112' and then the beam is expanded by a known beam expander 113 and led through a collimator lens, and further led through a beam splitter 115. And transmission light beam and reflected light beam are both reflected by mirrors 112$t$ and 112$r$, and finally projected on a photoresist film formed on a semiconductor wafer 116. As the laser source 111, a He-Cd laser having wavelength of 3250 Å or 4416 Å, or Ar ion laser having wavelength of 4579 Å is usable. As the photoresist film, a known positive type photoresist of AZ1350 from Shipley Inc. is usable as having appropriate sensitivity region for the above-mentioned laser light wavelengths.

Provided that the laser wavelength is $\lambda$, pitch of the stripe pattern to be produced by the two light beam interference on the photoresist pattern is P, and angle between the two light beams incident on the photoresist film is $2\theta$, then the following relation holds:

$$P = \lambda/2 \sin \theta \qquad (3).$$

Since the angle $2\theta$ can be selected near 160°, a stripe pattern with pitch of almost half the wavelength is obtainable. That is, by suitably adjusting the angle $\theta$, a stripe pitch of between 0.2–2 $\mu$m is obtainable without using a particular mask.

Figure 8:
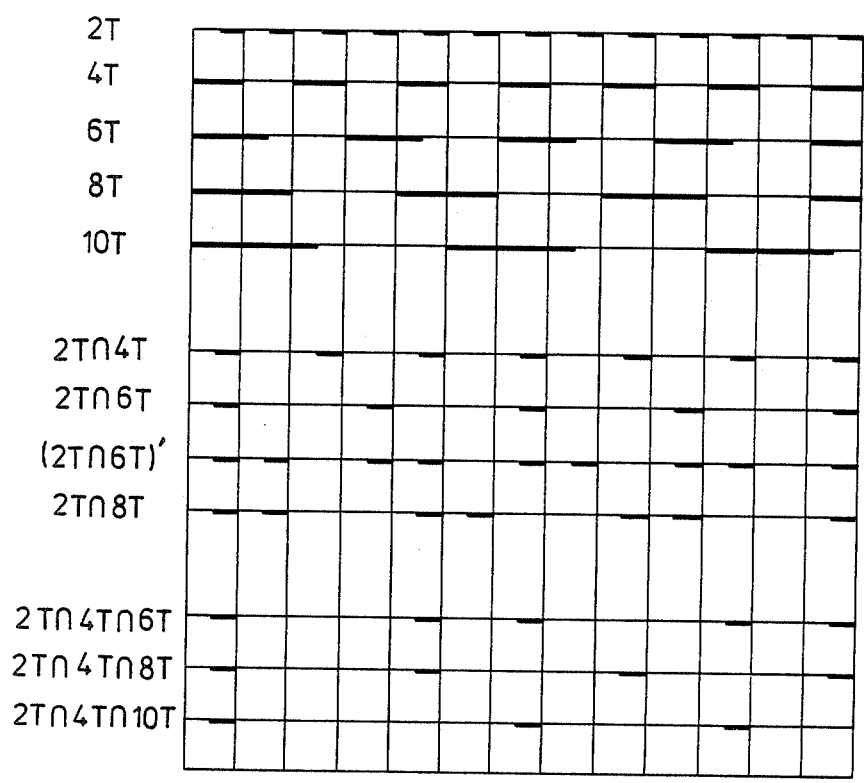
FIG. 8 is a diagram for elucidating forming of patterns embodying the present invention.

FIG. 8 illustrates various patterns to be obtainable by combining two or more exposures of various spatially repeated patterns, in which fundamental spatial period of repetition is 2T with respect to minimum line width T to be formed on the semiconductor device. For example, one exposure is made with an interval function $F_{(k,x)}$ which is represented as follows:

$$F_{(k,x)} = \begin{Bmatrix} 1: 2kT \leq x \leq (2k+1)T \\ 0: (2k+1)T < x < 2(k+1)T \end{Bmatrix}, \qquad (4)$$

where k is positive integers. Then, another exposure is made with another interval function $G_{(k,m,x)}$ represented as follows:

$$G_{(k,m,x)} = \left\{ \begin{array}{l} 1: 2kmT \leq x \leq (2k+1)mT \\ 0: (2k+1)mT < x < 2(k+1)mT \end{array} \right\}, \quad (5)$$

where k and m are positive integers. In this invention, the words interval function is defined as a function, value of which is defined by interval of its variable.

And then, the resultant exposure can be represented by the belowmentioned product function $H_{(x)}$:

$$H_{(x)} = F_{(k,x)} \times G_{(k,m,x)} = 1 \quad (6).$$

In FIG. 8 the lateral position indicates spatial positions on a wafer and upper five lines indicated 2T, 4T, 6T, 8T and 10T show interval functions of various intervals, and next four lines show product functions as indicated between two interval functions, and the bottom three lines show further product functions of three element products which correspond to three times exposure results.

Minimum line width T of the photoresist can be adjusted by about 25% by adjusting the amount of exposuring, and therefore the minimum line width can be selected within a range of:

$$T \pm 0.25\,T \quad (7).$$

Accordingly, the line width can be adjusted for practical use, depending on processes of semiconductor manufacturing or design of circuit.

The pattern produced by the product functions as indicated on the chart of FIG. 8 has the minimum line width T as their basis, and necessary pattern can be produced by superposed exposures of fringe patterns made by holographic interferences of different pattern pitch in a suitable combination, so that unnecessary patterns are removed by thinning. For instance, in the pattern represented as 2T∩6T, a photoresist pattern having spatial period of 2T is exposured and then the photoresist is again exposed to a pattern of spatial period of 6T. Then, among three unexposed lines in each sets of the first exposure pattern, two lines each are exposed, thereby retaining only one unexposed line in each set. In the similar way in another line representing a product of (2T∩6T)′, by making two exposures of spatial periods of 2T and 6T, but shifting the latter pattern by 2T spatial phase, a special pattern as shown in FIG. 8 is produced. That is, only one line of the set of three unexposed line is exposed.

In the similar way, in a pattern to be produced by three times superposed exposures, for instance, in the line represented by 2T∩4T∩6T, such a special pattern having 12T spatial pitch is produced wherein the pattern has sets of two lines each line having width T and separated with a gap of 3T, and the sets are disposed with 7T intervals inbetween.

The above-mentioned manufacturing method may be usable for the conventional line width T of about 2 μm. But this manufacturing method is drastically advantageous when the line width T is selected shorter than 1 μm, i.e. in submicron, because in such submicron region, hitherto only X-ray exposure, electron beam exposure and ion beam exposure has been usable, and these exposures are expensive and time taking in comparison with the present invention. For instance, when the line width is 1 μm, the minimum spatial period is 2T=2 μm, and therefore exposure pattern to be used in superposing on this has spatial pitch of 4 μm, 6 μm, 8 μm, etc.

That is, the unit of repetition pattern of these patterns is 2 μm, and therefore conventional mask technique can be utilized for such longer pitch patterns.

Figure 9:
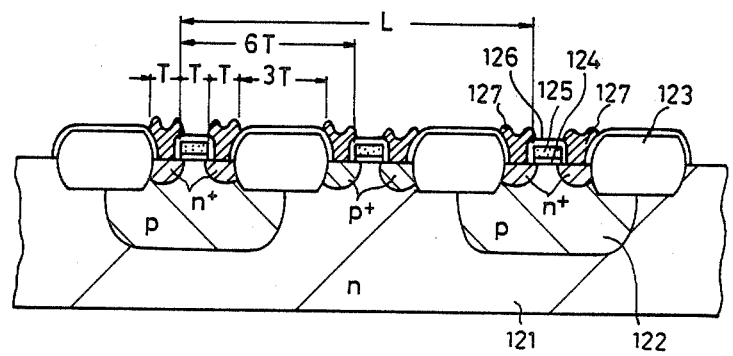
FIG. 9 is a sectional elevation view of a semiconductor IC embodying the present invention.
Figure 10:
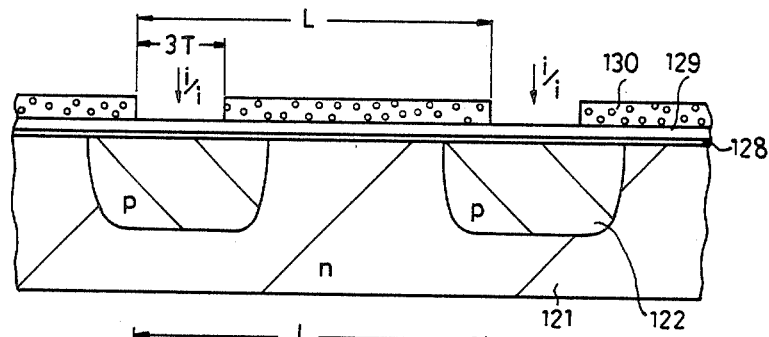
FIG. 10(a), FIG. 10(b) and FIG. 10(c) are sectional elevation views showing steps of making the semiconductor IC shown in FIG. 9.
Figure 10:
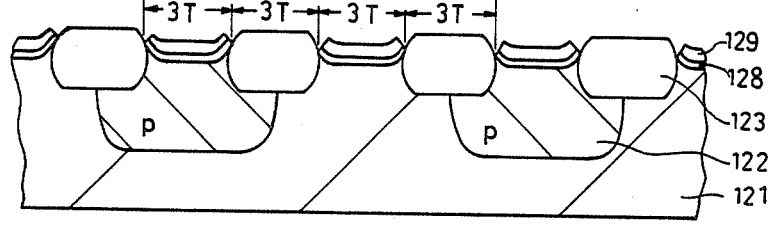
Figure 10:
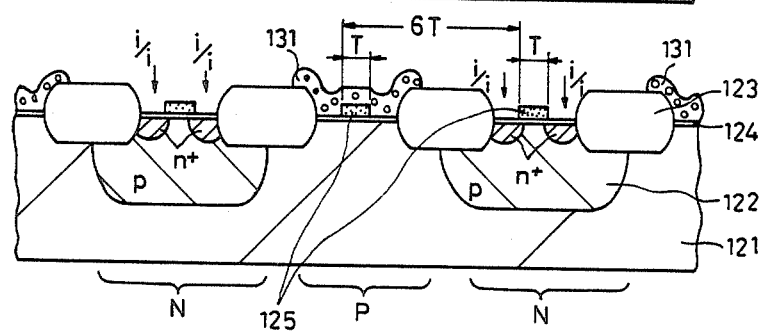

FIG. 9 shows one actual example of a semiconductor IC embodying the present invention and FIG. 10(a), FIG. 10(b) and FIG. 10(c) show steps of manufacturing process embodying the present invention.

Firstly on the whole surface of an n-type semiconductor wafer 121, a composite layer consisting of an underlying $SiO_2$ film 128 and an $Si_3N_4$ film 129 thereon on all the surface of the wafer 121, and then an ion implantation i/i is carried out through a photoresist pattern 130 so as to form p-conductivity type well 122 of a diffused region. At this time a pattern 130 of the photoresist film is designed by taking intended minimum linewidth T as unit of a design. For instance, an opening of the photoresist pattern is designed to have 3T width as shown in FIG. 10(a). Then after ion implantation, the wafer is heated to carry out a thermal diffusion, thereby to form the p-type conductivity wells p, as shown in FIG. 10(a).

Then, the composite film 128+129 on the silicon wafer is etched so as to form openings for oxidation of the silicon wafer, and field oxide layers 123 are formed for every channel. At this time, the spatial repetition period of the field oxide film is selected to be 6T, and the width of the oxidized parts are selected to have 3T width, as shown in FIG. 10(b). Then, the composite film consisting of $SiO_2$ film 128 and $Si_3N_4$ film 129 is removed by known method, and polycrystalline silicon gate electrodes 125 are formed by known method to make gates, and then by utilizing this polycrystalline silicon gate electrodes 125 as mask, source region and drain region of n+ conductivity type are formed by ion implantation. In the example of FIG. 10(c), the ion implantation to form the source region and the drain region is made only to scheduled p conductivity type well parts of NMOS part N, and other parts which are PMOS parts P are covered by a photoresist film 131. And thereafter, an ion implantation is also carried out into the PMOS parts, by utilizing the polycrystalline silicon gate electrodes 125 as mask. Thereafter, the polycrystalline silicon gate electrodes 125 are covered and insulated by oxide film 126 formed by, for instance, known plasma method and aluminum wiring lines 127 are provided, to complete transistors as shown in FIG. 9. In this example, the polycrystalline silicon gate electrodes 125 are formed to have line width of T and provided with repetition period of 6T intervals. Such pattern can be formed by the pattern represented by 2T∩6T as shown in FIG. 8. The aluminum wiring lines 127 are, as shown in FIG. 9, provided parallelly with line widths of T, with space of line width T on the polycrystalline silicon gate electrodes 125, and with repitition pitch of 6T. Such pattern of the aluminum wiring lines can be made by pattern represented by (2T∩6T)′ as shown in FIG. 8.

Figure 11A:
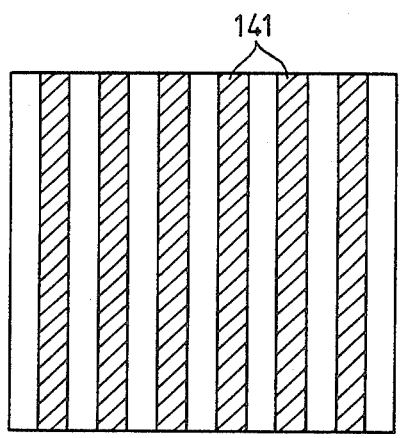
FIG. 11(a), FIG. 11(b), FIG. 12 and FIG. 13 are front views showing ways of forming pattern embodying the present invention.
Figure 11B:
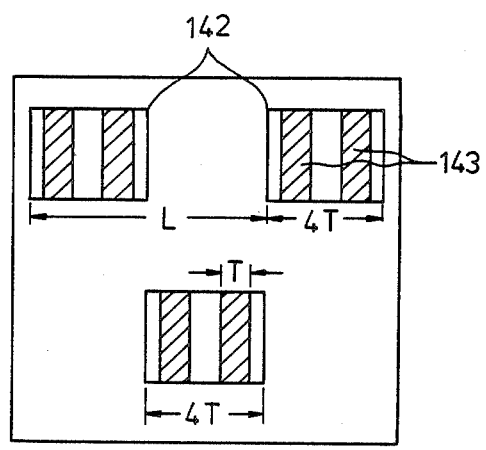

FIG. 11(a) and FIG. 11(b) show another example wherein gate electrodes are disposed in two dimensional way. Firstly, as shown in FIG. 11(a), on all the surface area of the wafer, line and space stripe pattern 141 is formed by utilizing a laser holography apparatus. This pattern is only parallel stripe lines disposed with 2T pitch and there is no desired pattern yet produced. Then, as shown in FIG. 11(b), only selected parts 142 of the stripe are retained by another exposuring wherein the desired parts are masked not to be exposed, thereby to produce the pattern of FIG. 11(b). In the pattern shown in FIG. 11(b), every unit parts 142 has 4T width, and accordingly, when the minimum line width T is selected as 0.5 μm, then the width of each unit cell part is 2 μm, and mask of such pattern 142 of such size can be easily produced by the conventional photolithographic technology.

Figure 12:
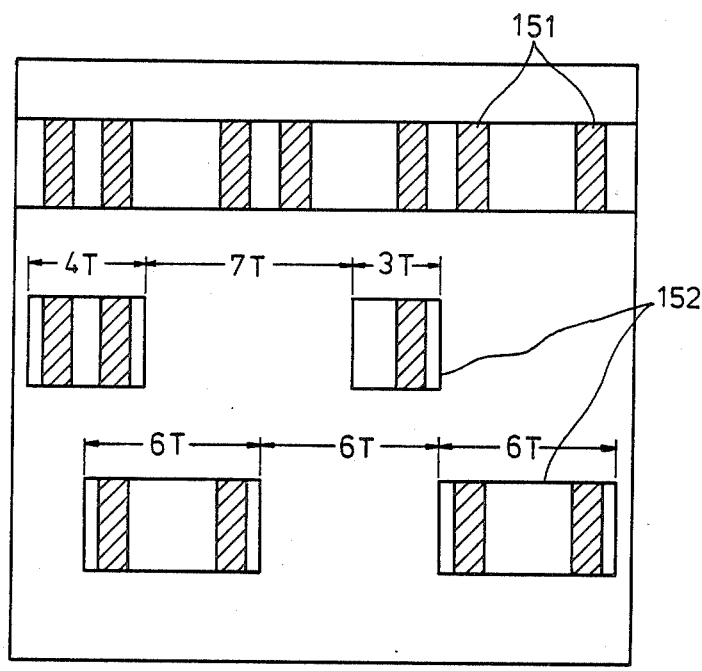

FIG. 12 shows another example of forming gate electrodes in two dimensional disposition. In this embodiment, the pattern 151 of the top part of FIG. 12 can be produced by the pattern represented as (2T∩6T)' as shown in FIG. 8. And then, by applying another exposure on that pattern, by utilizing mask having pattern of width which has widths of 3T, 4T, 6T, etc. to cover the unit cell parts 152, a pattern having gate electrodes at desired parts of unit cell as shown in FIG. 12 can be obtained.

Figure 13:
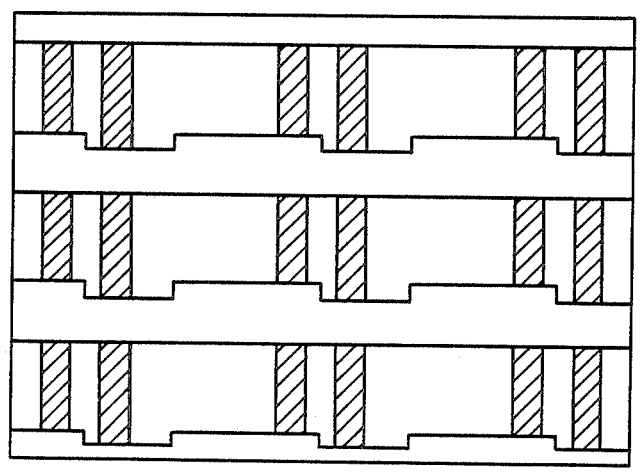

FIG. 13 shows a special pattern in which gate electrodes are disposed regularly in two dimensional way, and this pattern is obtained by utilizing the pattern represented as 2T∩8T in FIG. 8.

Contact window to make contact between the polycrystalline silicon gate electrodes, source region, drain region and wiring aluminum lines, etc., can be made by superposed exposuring of lines of width T and horizontal lines which have pattern to cross the width T lines.

When line width of the pattern becomes less than 1 μm, the conventional post-baking hitherto carried out to improve etching resistivity (against sputter etching, reactive sputter etching or plasma etching, etc.) causes deforming of pattern thereby inducing undesirable touching with the neighboring pattern, and such undesirable deformation has been liable to be reproduced even for a pattern of 2 μm line width. And the deformation is liable to deform edge of the 2 μm line pattern and an admissible maximum deformation limit is about 0.4 μm. As for 0.5 μm line width pattern, the 0.4 μm line pattern deformation can not be acceptable. Such deformation phenomenon can be eliminated by hardening the surface of the photoresist pattern after development of the pattern. Such hardening can be made by applying plasma or ions on the photoresist surface. When the photoresist is post-baked in a high temperature, the photoresist film is appropriately hardened and accordingly, even when another photoresist film is applied thereon, the previous underlying photoresist film does not melt out or varnish.

Figure 14:
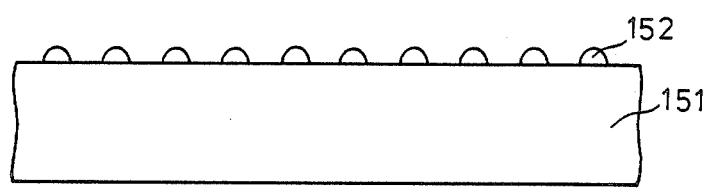
FIG. 14(a), FIG. 14(b) and FIG. 14(c) are sectional elevation views showing steps of forming pattern embodying the present invention.
Figure 14:
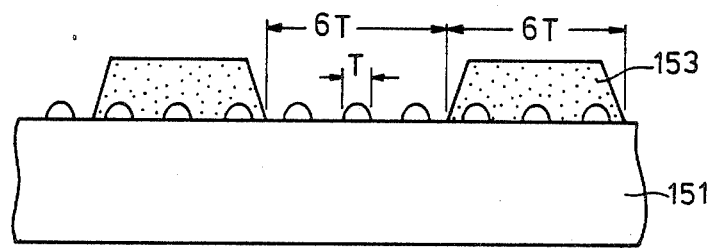
Figure 14:
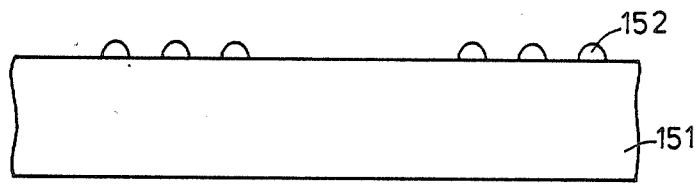

FIG. 14 shows another example of pattern forming by utilizing a double layered photoresist. As shown in FIG. 14(a), stripe line-and-space pattern 152 of a photoresist film is formed on a wafer 151 by laser holography exposure, and then the surface of the photoresist film is treated with plasma. And thereafter the photoresist film is post-baked, to give acid-resistivity and alkaline-resistivity. Then another photoresist film 153 is applied thereon, and after exposuring with a desired pattern as shown in FIG. 14(b), the second photoresist 153 is developed. In the second photoresist film 153 the line width of the pattern is 6T. Then by utilizing the second photoresist film pattern 153 as mask, the composite photoresist films 152+153 are etched away. The etching is preferably made by O$_2$ plasma etching, therewith only the resist pattern is removed. When no post-baking is made, the second photoresist pattern 153 can be removed by another exposure and development, and the first photoresist pattern at desired parts only are retained as shown in FIG. 14(c).

The above-mentioned pattern making processes are described taking example of using photoresist films, but other photolithographic pattern making method such as photosensitive film utilizing silver salt or other photochemical reactive substance will be utilized.

FIG. 15 shows another example embodying the present invention. FIG. 15(a) shows general front view of a semiconductor IC of the embodiment and FIG. 15(b) is a partially enlarged front view of a part encircled by a square b, the semiconductor IC has generally two or more parts such as shown by the part A and the other part B. And the part A is, for instance, a memory and the part B, for instance, is a related processor circuit. In such IC, the transistors contained in the part A and part B are designed to have different characteristics, and therefore as shown in FIG. 15(b), for instance, the size of the transistor, or pitch of the gates are different between the parts A and B. In such case, the different sizes of transistors can be made by firstly making pattern of larger size, for instance 2T width gates, and thereafter for the transistors of the smaller gates, the pattern can be superposedly exposured to decrease the line width.

Alternatively, a combination of the conventional photolithographic pattern making and the holographic pattern making embodying the present invention may be used.

Figure 16A:
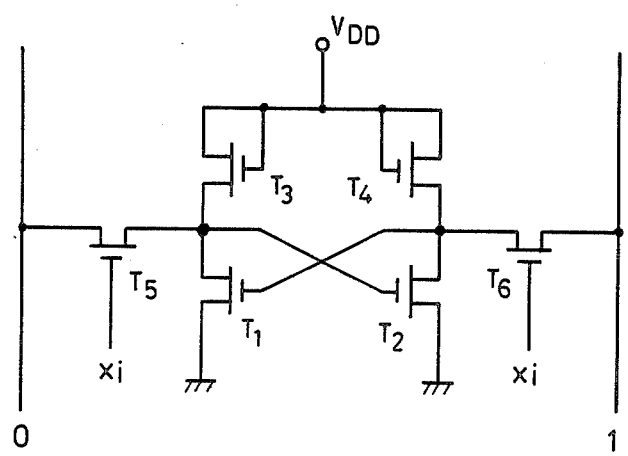
FIG. 16(a), FIG. 16(b) and FIG. 16(c) are circuit diagram, schematical circuit connection diagram and actual plan view of a six element memory cell embodying the present invention.
Figure 16B:
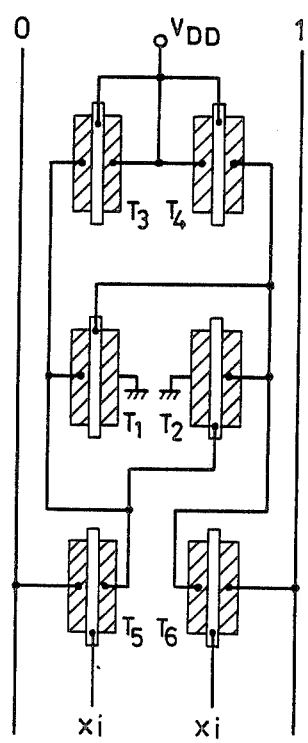
Figure 16C:
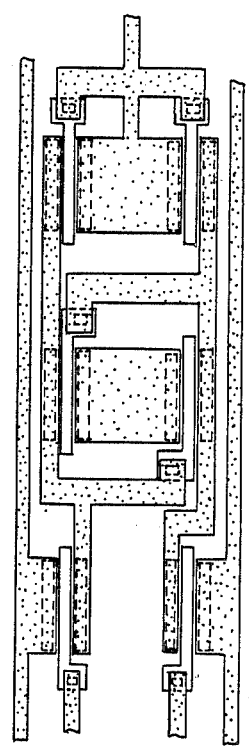

FIG. 16(a) shows a circuit of one unit cell of a MOS static RAM to be produced by the parallel disposed gates embodying the present invention, and FIG. 16(b) shows relation between the electrode dispositions and interconnection of wires in the unit cell, and FIG. 16(c) shows an actual pattern of the MOS static RAM. In this example, the unit cell comprises six elementary transistors but in substance it comprises a flip-flop circuit consisting of transistors T1, T2 and load transistors T3 and T4. And the output of the circuit is issued through the transistors T5 and T6 to the column wires of 0-side and 1-side. Wires Xi are input lines to receive row selection signals to the input transistors T5 and T6 so that only selected unit cell of the RAM circuit is selected by the selection signal. Though the above mentioned example takes a case of six element MOS static RAM, a four element dynamic RAM consisting of the flip-flop circuit having the four elements and two capacitors can be produced in the similar way as shown in FIG. 17(a).

Figure 17A:
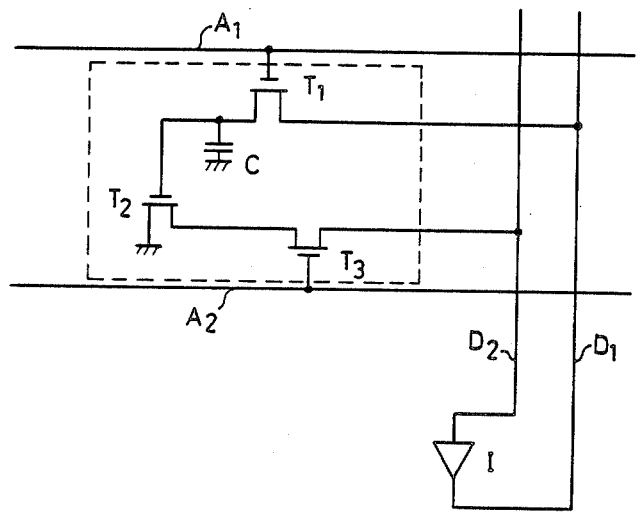
FIG. 17(a), FIG. 17(b) and FIG. 17(c) are circuit diagram, schematical circuit connection, a three element memory cell embodying the present invention.
Figure 17B:
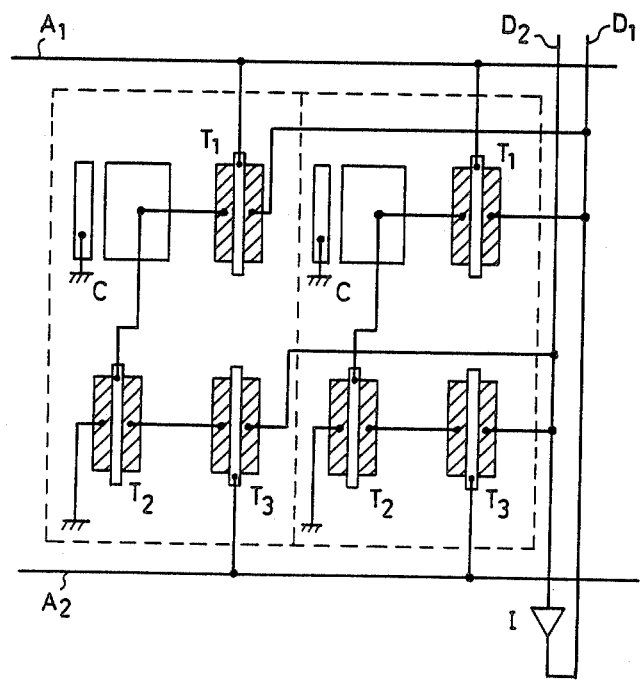
Figure 17C:
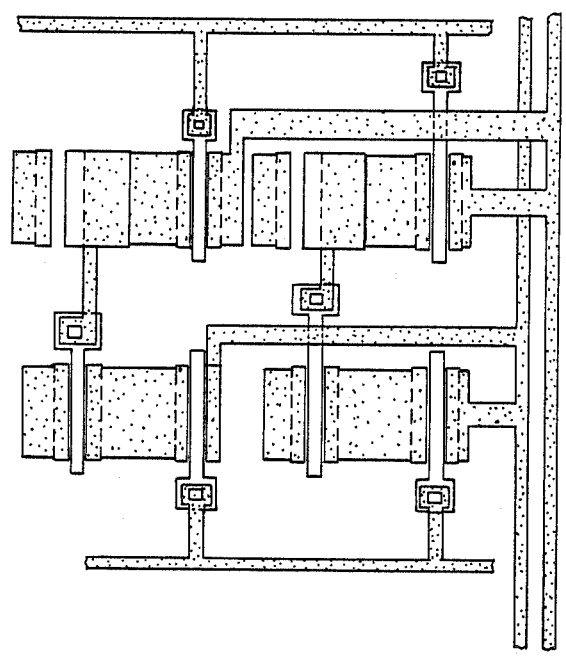

FIG. 17(a) and FIG. 17(b) show an element of one unit cell circuit of a three element MOS dynamic RAM realized by embodying the present invention, and FIG. 17(a) is its circuit diagram and FIG. 17(b) shows relation of the electrode dispositions and related interconnection between the elements. In this example three transistors T1, T2 and T3 have all their gate electrodes in parallel, and gates of the transistors T1 and T2 are on a same line, and writing address wire A1 and reading address wire A2, writing data wire D1 and writing data wire D2 as well as grounding points are connected in the unit cell circuit encircled by dotted lines. In this unit cell, the transistors T2 and capacitors C store information. Since the reading out is made through the transistor T3 in an inverted polarity, an inverter amplifier I is provided for refreshing. By disposing the unit cell in matrix pattern, selection of information by XY address can be made.

As has been described for six elements static RAM and three elements dynamic RAM, these semiconductor IC must have a large number of unit elements to be very highly integrated. Accordingly, in order to achieve such high integration, the gate length and forming rules of each unit circuit has been intended to be in submicron. However, if the IC is produced by conventional way by changing gate length for different parts and disposing the gate in different directions, then such IC will have several undesirable troubles, such as electron beam proximation effect, and in order to avoid such troubles a long time amending of pattern drawing condition, and accordingly, it has been impossible to drastically increased through-put. However, in the present invention, an improved efficiency is obtainable by disposing all the gates in one direction and on the same lines. Furthermore, according to the holographic exposuring process of the present invention, manufacturing with very high through-put is achievable.

Figure 18A:
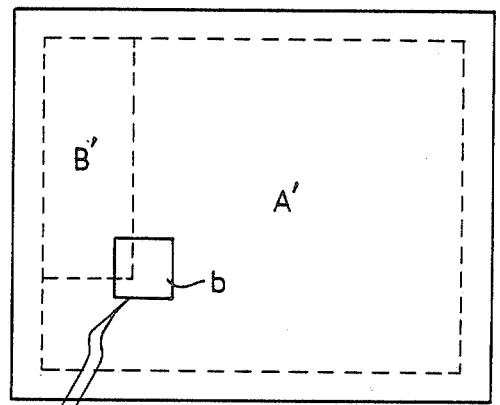
FIG. 18(a) and FIG. 18(b) are lateral front view and partially enlarged front view of another semiconductor IC in accordance with the present invention.
Figure 18B:
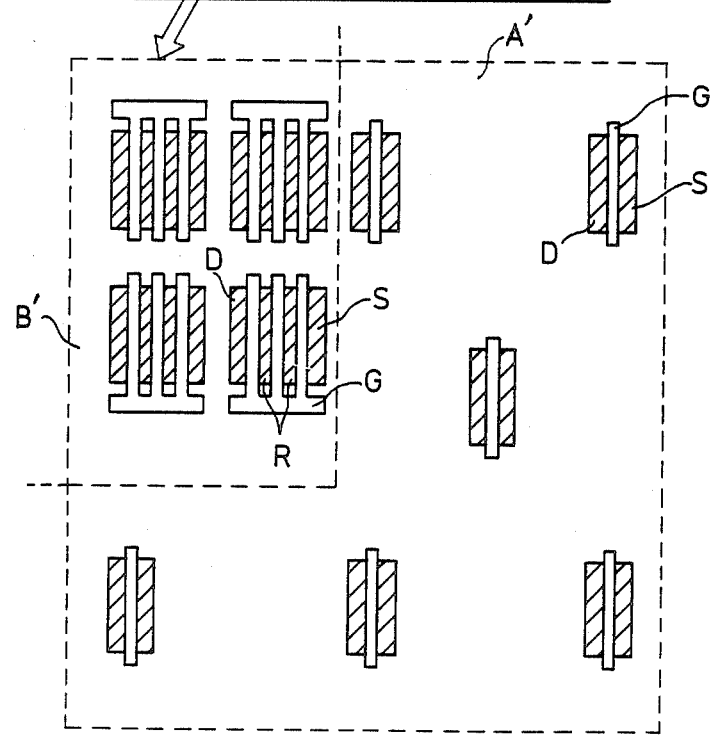

FIG. 18(a) and FIG. 18(b) show still another example embodying the present invention. FIG. 18(a) is a general view of a semiconductor IC and FIG. 18(b) is a partially enlarged view of a part encircled by a block b. In this example, IC has two parts, namely part A' and part B' of each other different transistor design, for instance, the part B' requires transistors of longer gate length than part A'. Alike FIG. 15(a) and FIG. 15(b), all the gate electrodes are formed with a length of several integer times T included in unit cells of 2T times several integer widths. Thereafter, to limit narrower gate widths, another exposure is made to obtain intended gate width. FIG. 18(b) show an example where a gate has three lines and between the three gate lines, impurities are diffused to form low resistance region, in order to make a composit gate with an integer times T width.

Figure 19A:
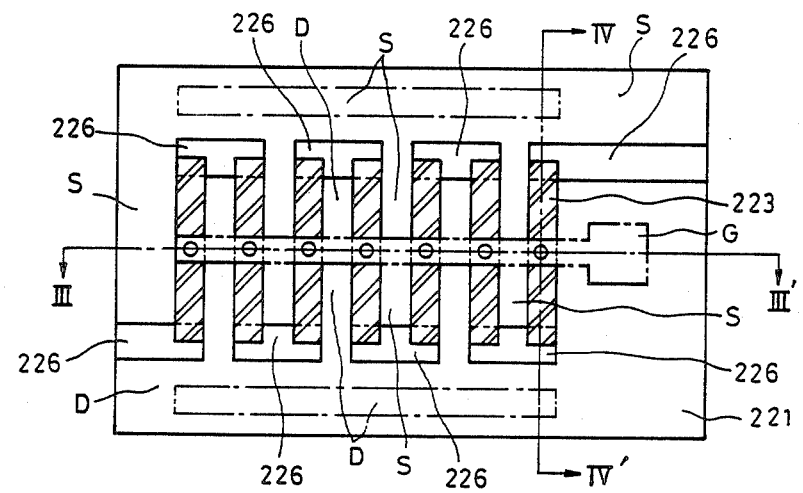
FIG. 19(a) is a plan view of a still another semiconductor IC embodying the present invention.
Figure 19B:
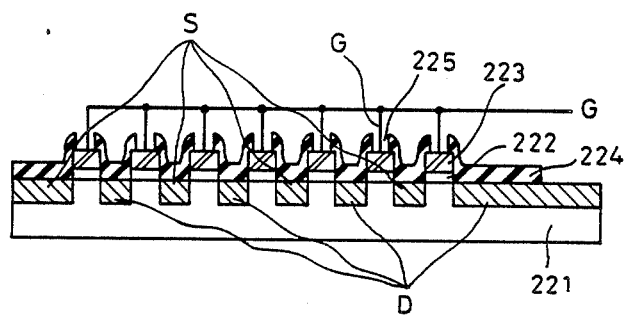
FIG. 19(b) is a sectional elevation view at sectional line III-III' of FIG. 19(a)
Figure 19C:
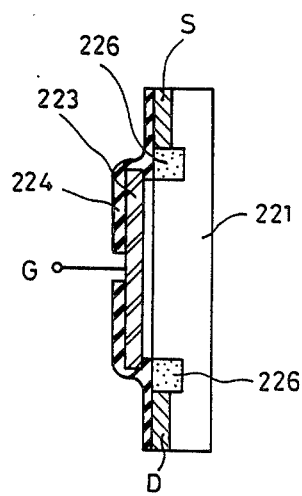
FIG. 19(c) is a sectional elevation view at the sectional IV-IV' of FIG. 19(a).

FIG. 19(a) and FIG. 19(b) show still another embodiment characterized by transistors of large mutual conductance Gm by parallel connection of several FET having the uniform gate width. FIG. 19(a) is a cross sectional view at the sectional plane III-III' of FIG. 19(a). The transistor comprises gate oxide film 222, polycrystalline silicon gate electrode 223, oxide film 224, isolation region 226, and the oxide film 224 has contact openings for gate electrode connection. This embodiment has a technical advantage that by adopting saw-teeth shaped source and drain regions, an FET of this configuration has a high mutual conductance Gm without fear of undesirable centering of electric field at particular parts.

Figure 20:
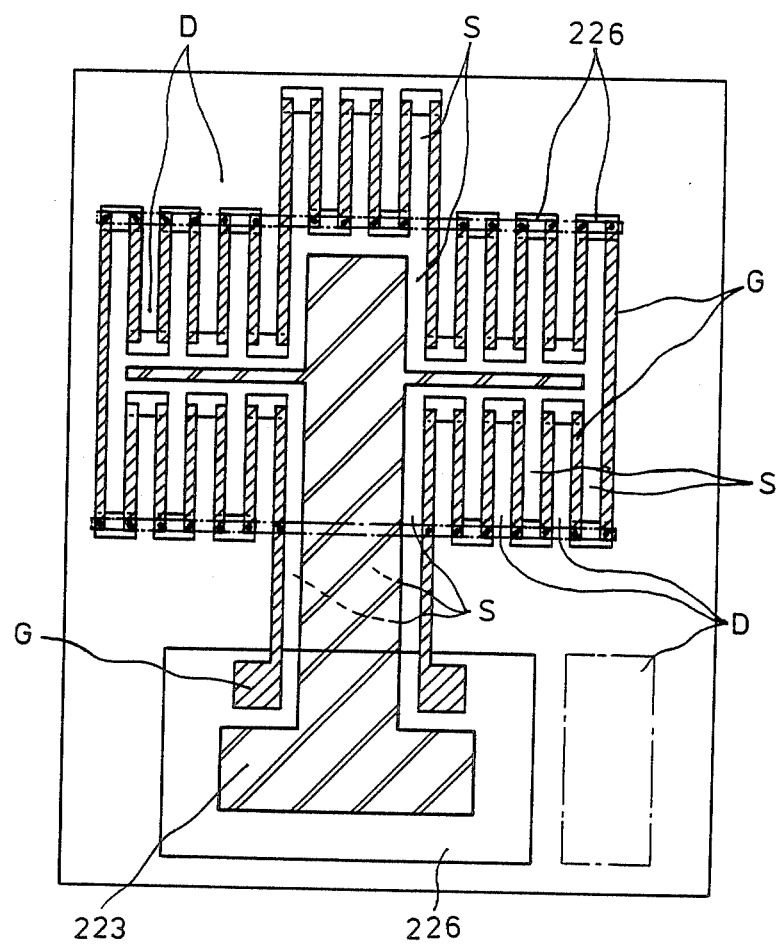
FIG. 20 is a front view of another semiconductor IC made by modifying the embodiment of FIG. 19.

FIG. 20 shows an example as a modification of the configuration of FIG. 19(a). In this example, the isolation regions 26 and the gate electrodes are in modified shapes to simplify the interconnection in the device.

Furthermore, process of making the semiconductor IC in accordance with the present invention can be drastically simplified by providing a hologram at least in one of the optical path of two light beams to form the interference stripe pattern.

Figure 21:
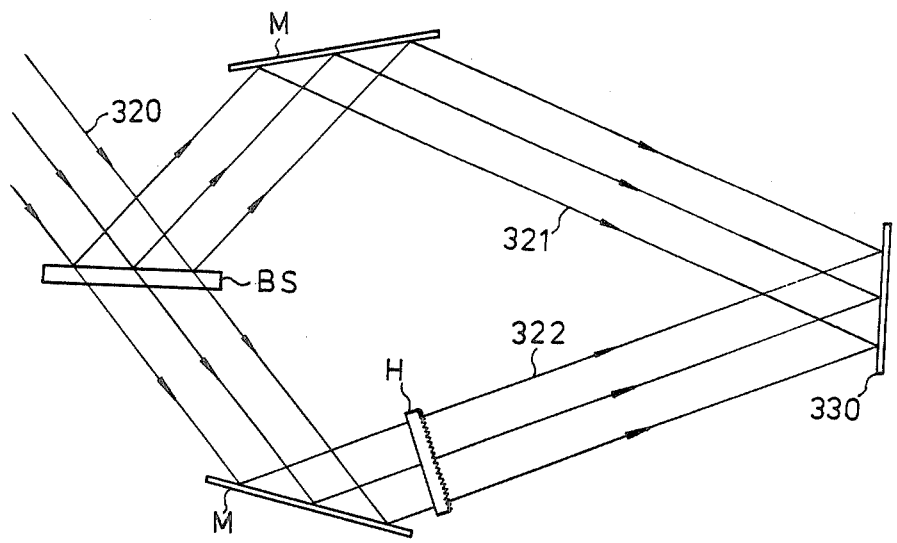
FIG. 21, FIG. 24 through FIG. 26 are disposition diagram of manufacturing apparatus to form two light beam interference patterns having hologram(s) in light path(s) for carrying out holography exposuring.

FIG. 21 shows one example of an apparatus and process for manufacturing semiconductor IC in accordance with the present invention. In this example, the way of recording a stripe pattern is substantially the same as a Frennel holography, but instead of a light beam reflected from an object a light issued through a hologram H is used to make an interference of two light beam. The hologram in this example is such hologram as to diffract light of parallel incidence thereto making an interference stripe pattern on a semiconductor wafer 330 on which a photoresist film is coated. And such special hologram is not such one for obtaining an image by an interference of a reference rays and the other rays which is reflected from object. In order to obtain such special hologram H, a black and white pattern must be made by calculation with a computer, since there is no object to be recorded.

Figure 22:
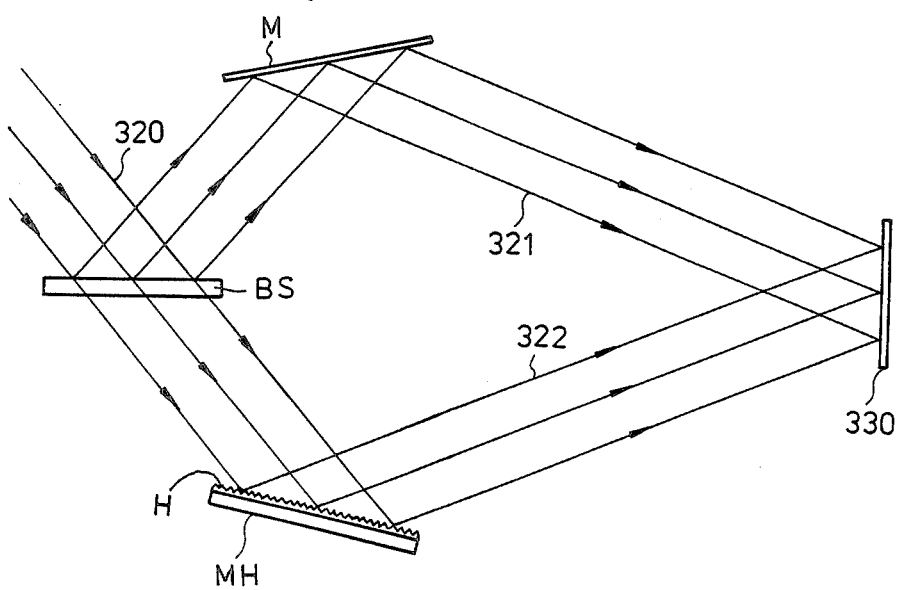
FIG. 22 is a sectional view showing a combination of hologram and a plane mirror to be used to embody the present invention.

FIG. 22 shows still another example of using another type of hologram. In this example, a hologram M is combined with a mirror H.

Figure 23A:
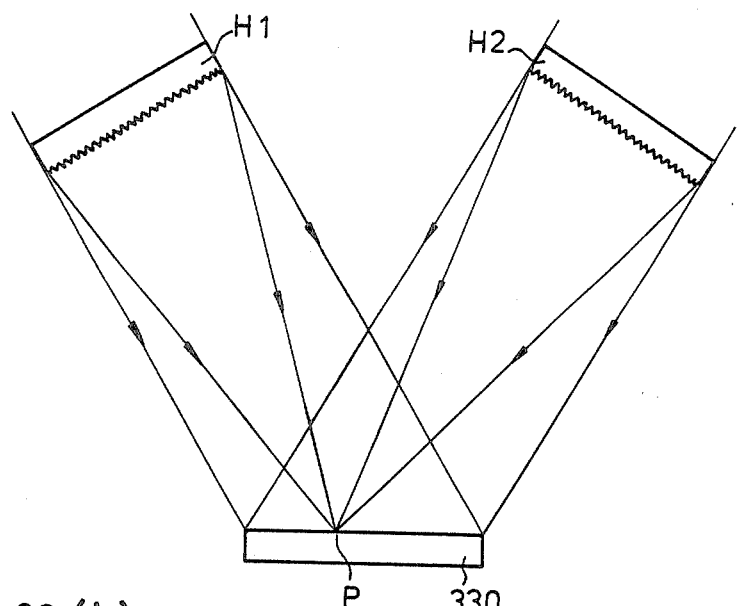
FIG. 23(a) is a disposition diagram of an apparatus for making two light beam interference pattern embodying the present invention.

FIG. 23(a) shows another example embodying the present invention, wherein hologram H1 and H2 are disposed in light path of conjugate light beams which are to be projected on a wafer 30, thereby converging both light beams in a manner that two light beams are converged by respective holograms H1 and H2 on the same point P on the wafer 330.

As the hologram H1 and H2, a grating having stripes of, for instance, a Frennel type pattern are used, so that light beams converged by the holograms H1 and H2 each other interfere on the point p, thereby improving resolution and contrast of resultant pattern on the wafer.

Figure 23B:
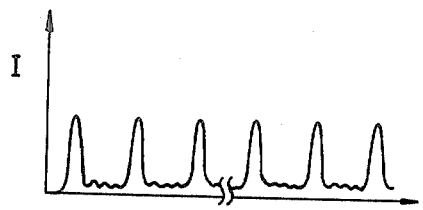
FIG. 23(b) is a diagram showing distribution of high energy along the position of a photoresistor on which two light beam interference pattern is produced.

FIG. 23(b) shows relation between spatial position on the wafer pattern and light intensity, which shows that plural number of light intensity peaks are made by the method shown in FIG. 23(a). It is found that maximum values obtained in this process is larger in contrast than the case of making the stripe pattern by mere interference of plane waves and that satisfactory resolution compared to that obtained by using plane waves is achievable. This process can produce arbitrary shape with integer times line width of interference pattern at arbitrary positions with integer times distance of interference pattern by selecting focal positions of the holograms H1 and H2.

Figure 24:
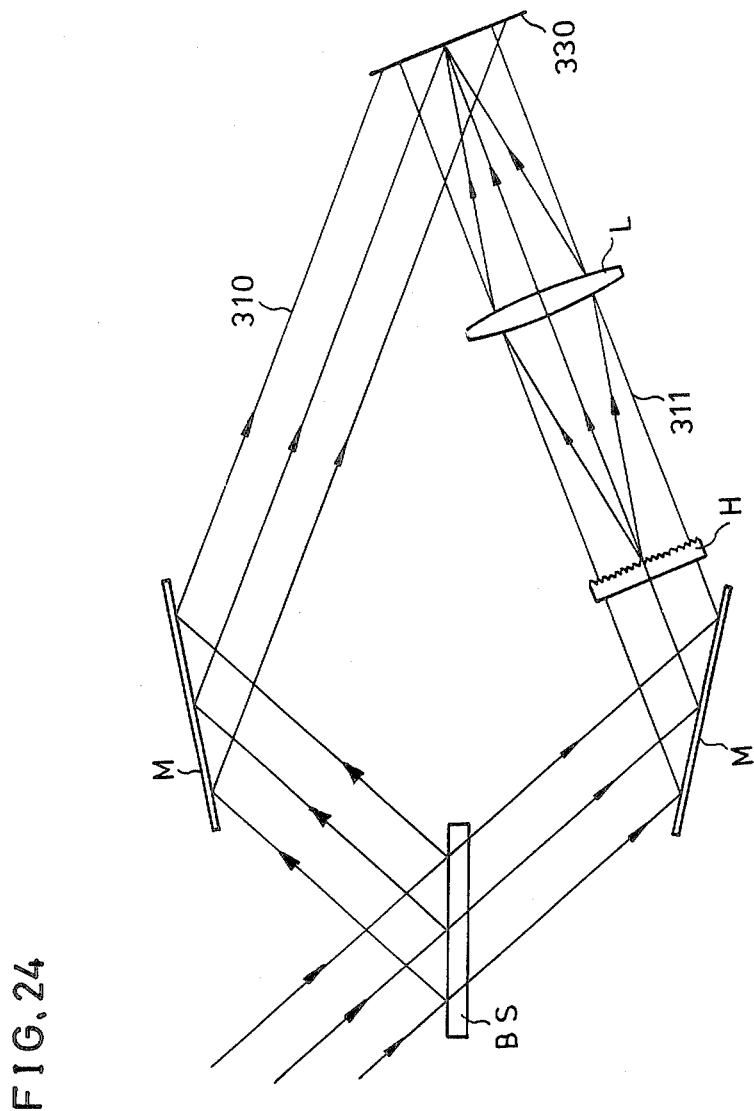

FIG. 24 shows still another example embodying the present invention wherein, an ordinary convex lens L is inserted in a light beam course 311 which passes a hologram H and the lens-converged light beams and non-lens-converged light beam 310 are both projected on a surface of a wafer 330. One point on the hologram H corresponds by means of the optical system L to a point on a surface of a wafer 330 and therefore a pattern on the hologram H can be transferred and projected on the wafer. However, since the pattern on the hologram H diverges by defraction, a reference light beam of a plane wave is projected at the same time on the wafer; thereby deterioration of the resolution and contrast is prevented. Since a smallest image is produced on the surface of a wafer 330 when positional relation between the hologram H and the optical system L is selected in a manner that the hologram is disposed at a focal point of the optical system, the hologram H is disposed at the focal position of the optical system L.

Figure 25:
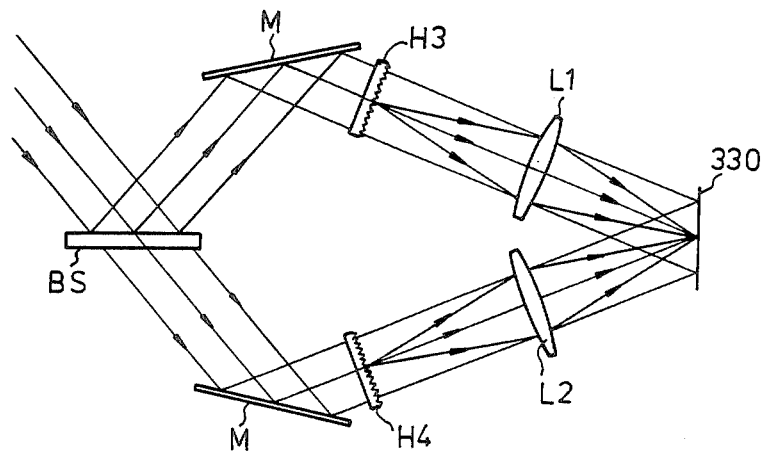

FIG. 25 shows still another example embodying the present invention wherein two light beams splitted by a beam splitter BS are led through holograms H3 and H4 and optical systems L1 and L2 such as convex lenses, to project the light beams on the wafer surface so as to make interference on the surface. By this process, improvement of contrast and resolutions are intended.

Figure 26:
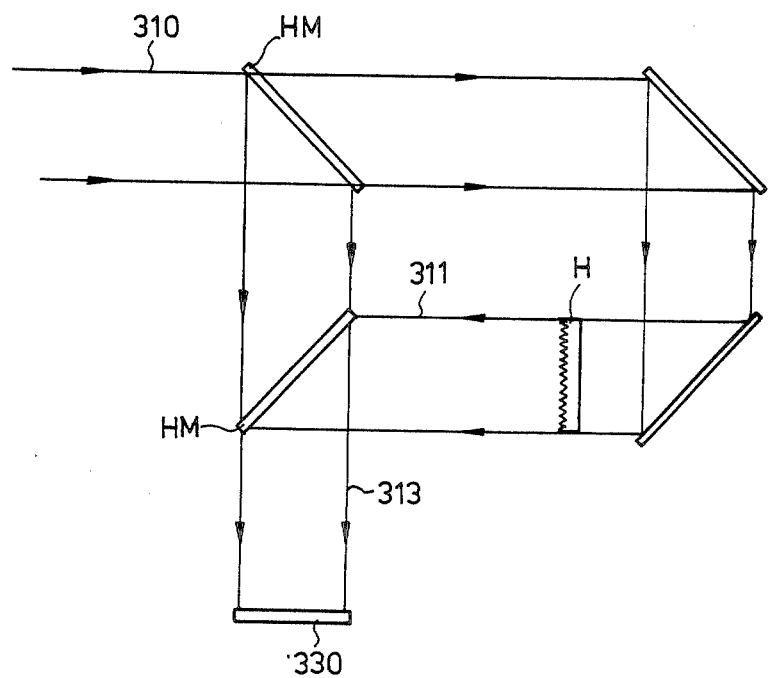

FIG. 26 shows still another example embodying the present invention wherein two light beams splitted by a beam splitter BS are led respectively through a mirror M and through a hologram H and both light beams are combined by a half mirror HM and the combined light beams are projected on the surface of a wafer 330. In this configuration, since the two light beams are combined by the half mirror HM, the light beams can be projected normally onto the wafer surface. Therefore, positional adjustment between the wafer 330 and the light beam 313 becomes simple, and the registration time can be shortened.

As has been described with respect to many examples, the present invention can achieve production of minimum pattern width of p/2 of λ/(2 sin θ), where λ is wavelength of coherent light and 2θ is angle between two light beams to be projected on the wafer surface. Accordingly, the pattern width can be made as approximately ½ of the wavelength of light, and therefore such very narrow line width of 0.1 μm or less can be produced when a laser of a short wavelength, such as an eximer laser is used.

What is claimed is:

1. A method for making a semiconductor device comprising the steps of:
   coating a photoresist layer on a semiconductor wafer;
   producing at least two coherent beams as an exposure beam,
   applying said two coherent beams onto said photoresist layer to generate an interference fringe so that a first pattern of said interference fringe having space period of 2T with respect to a minimum line width T is formed, said first pattern being formed by a holographic exposure method;
   further applying one of said two coherent beams and another exposure beam onto said photoresist layer for imaging at least one other pattern having a space period of an integer times that of said first pattern whereby said first pattern is deleted in part by said other pattern;
   developing said exposed photoresist to obtain a patterned photoresist layer; and
   processing said semiconductor wafer by using said patterned photoresist layer, to obtain a pattern of said semiconductor wafer which is used as said gate of semiconductor device.

2. A method for making a semiconductor device comprising the steps of:
   coating photoresist layer on a semiconductor wafer;
   producing at least two coherent beams as an exposure beam;
   applying said two coherent beams onto said photoresist layer to generate an interference fringe so that a first pattern of said interference fringe, having a space period of 2T with respect to a minimum line width T is formed, said first pattern being formed by a holographic exposuring method, thereby to obtain a first exposed photoresist layer;
   developing said first exposed photoresist layer to obtain a first patterned photoresist layer;
   further applying one of said coherent beams and another exposure beam onto said first patterned photoresist layer for imaging at least one other pattern having a space period of integer times that of said first pattern, thereby to obtain a second exposed photoresist layer;
   developing said second exposed photoresist layer, thereby to obtain a second patterned photoresist layer; and
   processing said semiconductor wafer by using said second patterned photoresist layer, thereby to obtain a pattern of said semiconductor wafer which is used as said gate of semiconductor device.

3. A method for making a semiconductor device comprising the steps of:
   coating photoresist layer onto a semiconductor wafer;
   producing at least two coherent beams as an exposure beam;
   applying said two coherent beams onto said photoresist layer for generating an interference fringe so that a first repetition pattern repeating with a space period of 2T with respect to a minimum line width T is formed, said first pattern being formed by a holographic exposure method; and
   further applying one of said two coherent beams and another exposure beam on said photoresist layer for imaging at least one other repetition pattern repeating with space period of an integer times said 2T on said first repetition pattern;
   developing said exposure photoresist layer to obtain a patterned photoresist layer; and
   a step of processing said semiconduotor wafer by using said patterned photoresist layer, thereby to obtain a pattern of said semiconductor wafer.

4. A method for making a semiconductor device comprising the steps of:
   coating a photoresist layer on a semiconductor wafer;
   producing at least two coherent beams as an exposure beam;
   applying said two coherent beams onto said photoresist layer to generate an interference fringe so that a first repetition pattern of said interference fringe repeats with a space period of 2T with respect to a minimum line width T to thereby obtain a first exposed photoresist layer;
   developing said first exposed photoresist layer to obtain a first patterned photoresist layer;
   further applying one of said two coherent beams and another exposure beam on said first patterned photoresist layer for imaging at least one other repetition pattern repeating with space period of integer times said 2T on said first repetition pattern, thereby to obtain a second exposed photoresist layer;
   developing said second exposed photoresist layer, to obtain a second patterned photoresist layer; and
   processing said semiconductor wafer by using said second patterned photoresist layer, thereby to obtain a pattern of said semiconductor wafer.

5. A method for making a semiconductor device comprising the steps of;
   coating a photoresist layer onto a semiconductor wafer;
   producing at least two beams of coherent light as exposure beams;
   first applying said two coherent beams of wavelength λ onto said photoresist layer on said semiconductor wafer in order to generate an interference fring by an interference between said two beams to form a first pattern of said inteference fringe as defined by the following interval function equation:

$$F_{(k,x)} = \begin{matrix} 1: 2kT \leq x \leq (2k+1)T \\ 0: (2k+1)T < x < 2(k+1)T; \end{matrix}$$

where k is a positive integer and T is a controlled minimum line width, where 2T equals a pitch of said interference fringe which equals λ/2 sin θ, where 2θ is an angle formed between said two beams;
   second applying one of said two coherent beams and another exposure beam on said photoresist layer said second applying step using beams having a wavelength $\lambda_2$ to form a second pattern defined by the following second interval function equation $$G_j(k,m_i,x) = \begin{matrix} 1: 2km_iT \leq x \leq (2K+1)m_iT \\ 0: (2k+1)m_iT < x < 2(k+1)m_iT \end{matrix}$$

where j, k and mi are positive integers and wherein $2m_it$ equals a pitch of said interference fringe which equals $\lambda/2 \sin \theta_2$, wherein $2\theta_2$ is an angle formed between said beams used in said second applying step, whereby said first pattern is deleted in part by said second pattern, developing said exposed photoresist layer to obtain a patterned photoresist layer; and processing said semiconductor wafer by using said pattern photoresist layer, thereby to obtain a pattern of said semiconductor wafer which is defined by the following equation:

$$H_{(x)} = F_{(k,x)} \times G_{1(k,m,x)} \times G_{2(k,m,x)} \times \ldots$$

6. Method for making semiconductor device in accordance with claim 5, wherein $m_i = m$ and $$H_{(x)} = F_{(k,x)} \times G_{1(k,m,x)}.$$

7. Method of making a semiconductor device in accordance with claim 5, wherein
   said resultant pattern is formed in a region produced by combining plural patterns having integer times controlled minimum line width T.

8. Method for making semiconductor device in accordance with claim 5, wherein
   said first pattern is made by exposuring by laser holographic grating method.

9. A method for making a semiconductor device comprising the steps of:
   coating a photoresist layer onto a semiconductor wafer;
   producing at least two coherent beams as an exposure beam;
   applying said two coherent beams of wavelength $\lambda$ on said photoresist layer so that they meet at angle $2\theta$ for generating a first interference fringe, a first pattern repeating with a period of 2T with respect to a minimum line width T being formed, said interference fringe beign defined by the following first interval function equation:

$$F_{(k,x)} = \begin{matrix} 1: 2kT \leq x \leq (2k+1)T \\ 0: (2k+1)T < x < 2(k+1)T, \end{matrix}$$

where k is a positive integer and T is a controlled minimum line width, where $2T = \lambda/2 \sin \theta$, thereby to obtain a first exposed photoresist layer;

developing said first pattern as a first exposed photoresist layer to obtain a first patterned photoresist layer;

a step of further applying one of said two coherent beams and of another exposure beam on said first patterned photoresist layer for imaging a second pattern defined by the following second interval function equation;

$$G_j(k,m_i,x) = \begin{matrix} 1: 2km_iT \leq x \leq (2K+1)m_iT \\ 0: (2k+1)m_iT < x < 2(k+1)m_iT \end{matrix}$$

where j, k and $m_i$ are positive integers, thereby to obtain a second exposed photoresist layer;

developing said second exposed photoresist layer, thereby to obtain a second patterned photoresist layer; and processing said semiconductor wafer by using said second patterned photoresist layer, thereby to obtain a pattern of said semiconductor wafer which is defined by the following equations:

$$H_{(x)} = F_{(k,x)} \times G_{1(k,m,x)} \times G_{2(k,m,x)} \times \ldots$$

* * * * *